United States Patent [19]

Temple et al.

[11] Patent Number: 5,041,896
[45] Date of Patent: Aug. 20, 1991

[54] SYMMETRICAL BLOCKING HIGH VOLTAGE SEMICONDUCTOR DEVICE AND METHOD OF FABRICATION

[75] Inventors: Victor A. K. Temple, Clifton Park; Stephen D. Arthur; Peter V. Gray, both of Scotia, all of N.Y.

[73] Assignee: General Electric Company, Schenectady, N.Y.

[21] Appl. No.: 376,073

[22] Filed: Jul. 6, 1989

[51] Int. Cl.$^5$ ................ H01L 27/40; H01L 27/120; H01L 29/000
[52] U.S. Cl. .................................. 357/50; 357/33; 357/37
[58] Field of Search .................. 357/33, 37, 55, 50, 357/47, 13, 20, 23.4, 48, 49, 34

[56] References Cited

U.S. PATENT DOCUMENTS

| | | | |
|---|---|---|---|
| 3,394,037 | 7/1968 | Robinson | 148/187 |
| 4,047,195 | 9/1977 | Allison | 357/55 |
| 4,113,512 | 9/1978 | Ayers et al. | 148/1.5 |
| 4,135,291 | 1/1979 | Tursky et al. | 29/574 |
| 4,454,646 | 6/1984 | Joy et al. | 29/576 W |
| 4,466,180 | 8/1984 | Soclof | 29/580 |
| 4,498,227 | 2/1985 | Howell et al. | 29/576 B |
| 4,589,004 | 5/1986 | Yasuda et al. | 357/23.4 |
| 4,628,341 | 12/1986 | Thomas | 357/42 |
| 4,764,799 | 8/1988 | Malaviya | 357/49 |
| 4,807,011 | 2/1989 | Nonaka et al. | 357/45 |

FOREIGN PATENT DOCUMENTS 0010286  1/1978  Japan ........................ 357/55

Primary Examiner—Rolf Hille
Assistant Examiner—Peter Toby Brown
Attorney, Agent, or Firm—Marvin Snyder; James C. Davis, Jr.

[57] ABSTRACT

An improved symmetrical blocking high voltage semiconductor device structure incorporating a sinker region and a buried region adjacent the periphery of the chip improves device operating characteristics and simplifies device fabrication processes. A heavily doped polycrystalline refill of a trench provides a deep junction sidewall region which brings the lower high voltage blocking junction to the upper surface.

19 Claims, 13 Drawing Sheets

SYMMETRICAL BLOCKING HIGH VOLTAGE SEMICONDUCTOR DEVICE AND METHOD OF FABRICATION

BACKGROUND OF THE INVENTION

1. Field of the Invention

The present invention relates generally to the field of high voltage semiconductor devices, and more particularly, to such devices which have substantially identical breakdown voltages in both polarities.

2. Related Applications

The present application is related to application Ser. No. 190,903, now U.S. Pat. No. 4,904,609, entitled "Method of Making Symmetrical Blocking High Voltage Breakdown Semiconductor Device", filed May 6, 1988 by V.A.K. Temple, which is incorporated herein by reference.

BACKGROUND OF THE INVENTION

There is a significant need in the semiconductor arts for high voltage semiconductor devices such as MOS controlled thyristors (MCTs) which have the same breakdown voltage in both polarities. The above related application provides a high voltage device having symmetrical blocking voltages by forming grooves in the semiconductor wafer between chips after completion of device fabrication, including metallization. The grooves extend through the lower high voltage junction into the substrate. A sidewall region of the same conductivity type as the substrate is formed along the surface of those grooves where an intermediate region extends to that surface to bring that high voltage junction to the upper surface of the device where a termination structure like that for the upper high voltage junction is provided. Unfortunately, this structure can be difficult to fabricate because it is difficult to implant the sidewall region dopant into the portion of the groove wall adjacent the upper surface of the wafer which is substantially perpendicular to the upper surface of the wafer and because of a need to provide passivation on the surface of the grooves (which are formed after the formation of the metal electrodes which limits the temperatures to which the device can be exposed). The junction between the sidewall region and the interior of the device is a relatively shallow junction because of its implantation late in the fabrication process.

There is a need for an improved structure which facilitates manufacture and for an improved method of manufacturing symmetric blocking high voltage devices.

OBJECTS OF THE INVENTION

Accordingly, the primary object of the present invention is to provide a symmetric blocking high voltage device having a structure which facilitates its manufacture.

Another object of the present invention is to provide a symmetric blocking high voltage device which is free of passivation layers on the peripheral surface.

Still another object of the present invention is to provide a symmetric blocking high voltage device with a structure which prevents the appearance of high voltages along the peripheral surface of the chip.

A further object of the present invention is to provide a device having a deep sidewall junction.

SUMMARY OF THE INVENTION

The above and other objects which will become apparent from the specification as a whole, including the drawings, are achieved by providing a sinker region of the same (one) conductivity type as the substrate which extends into the intermediate region (of opposite type conductivity) from the upper surface of that region. This sinker region produces two beneficial effects. First, it eliminates the need to convert the upper portion of the peripheral surface of the chip to one type conductivity and thereby increases the minimum angle of the portion of the side surface of the device into which dopant must be implanted to form a region which brings the high voltage junction to the upper surface, thereby simplifying the implantation process. Second, it narrows the intermediate region of the device adjacent the peripheral or sidewall surface of the device. The device preferably includes a buried region of the first type conductivity which extends into the intermediate region from the substrate along the periphery of the chip. This buried region, in combination with the sinker region, further narrows the intermediate region adjacent the peripheral surface of the device. For appropriate depths of the sinker and buried regions, the portion of the intermediate region extending between them to the peripheral surface of the device is pinched off in reverse bias of the lower junction with the result that high fields are not present along the periphery of the chip which may therefore be left unpassivated without adverse effect on the device operating characteristics or useful life.

In accordance with an alternative embodiment of the invention, grooves are formed in the wafer which extend through the reverse blocking junction prior to the formation of localized regions of the device which extend to the upper surface of the device. These grooves are then back filled with heavily doped polycrystalline silicon of the same conductivity type as the substrate. During high temperature device fabrication steps, the heavy doping of the polycrystalline silicon backfill diffuses into the intermediate region at the periphery of the active portion of the device thereby bringing the lower junction to the upper surface as a deep junction in the single crystalline material. The wafer may either be diced so the peripheral surface of the chip is within the polycrystalline silicon material or so that there is some single crystalline semiconductor material between the peripheral surface of the device and the polysilicon material This structure may include either or both the sinker and buried regions.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
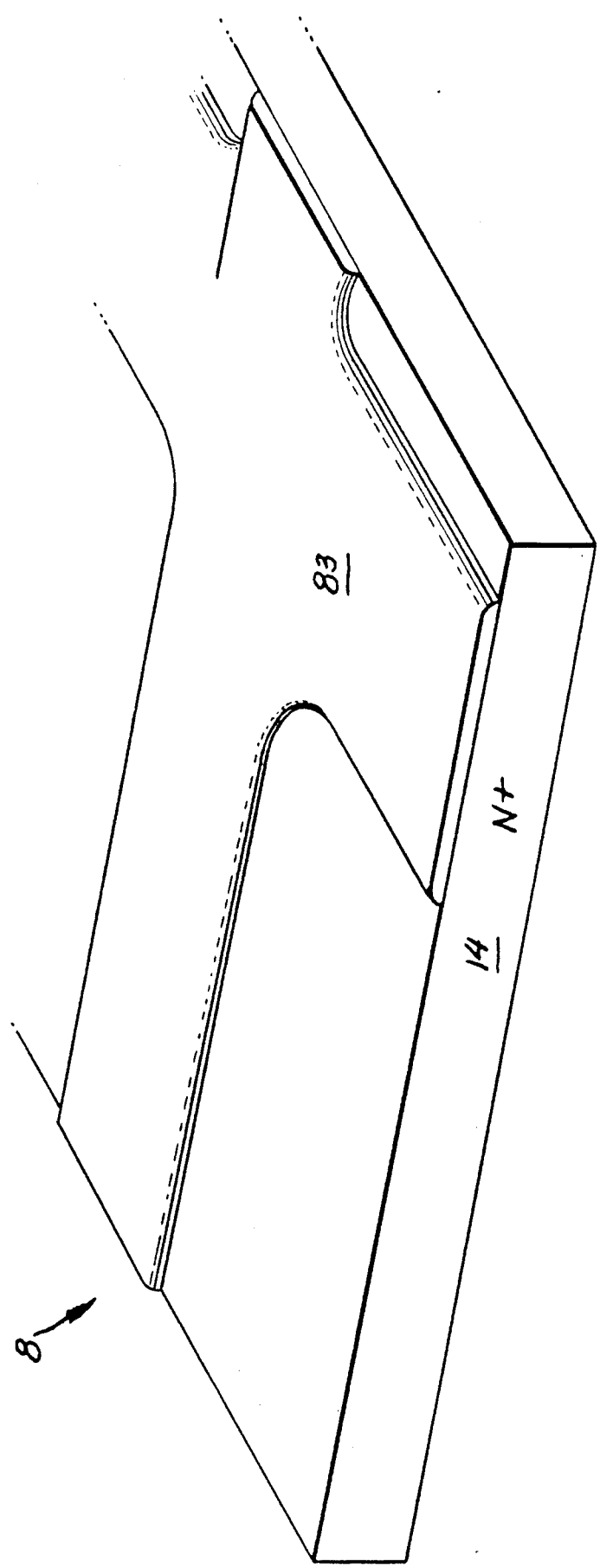
FIGS. 1-6 illustrate successive steps in the fabrication of one embodiment of the present invention.
Figure 2:
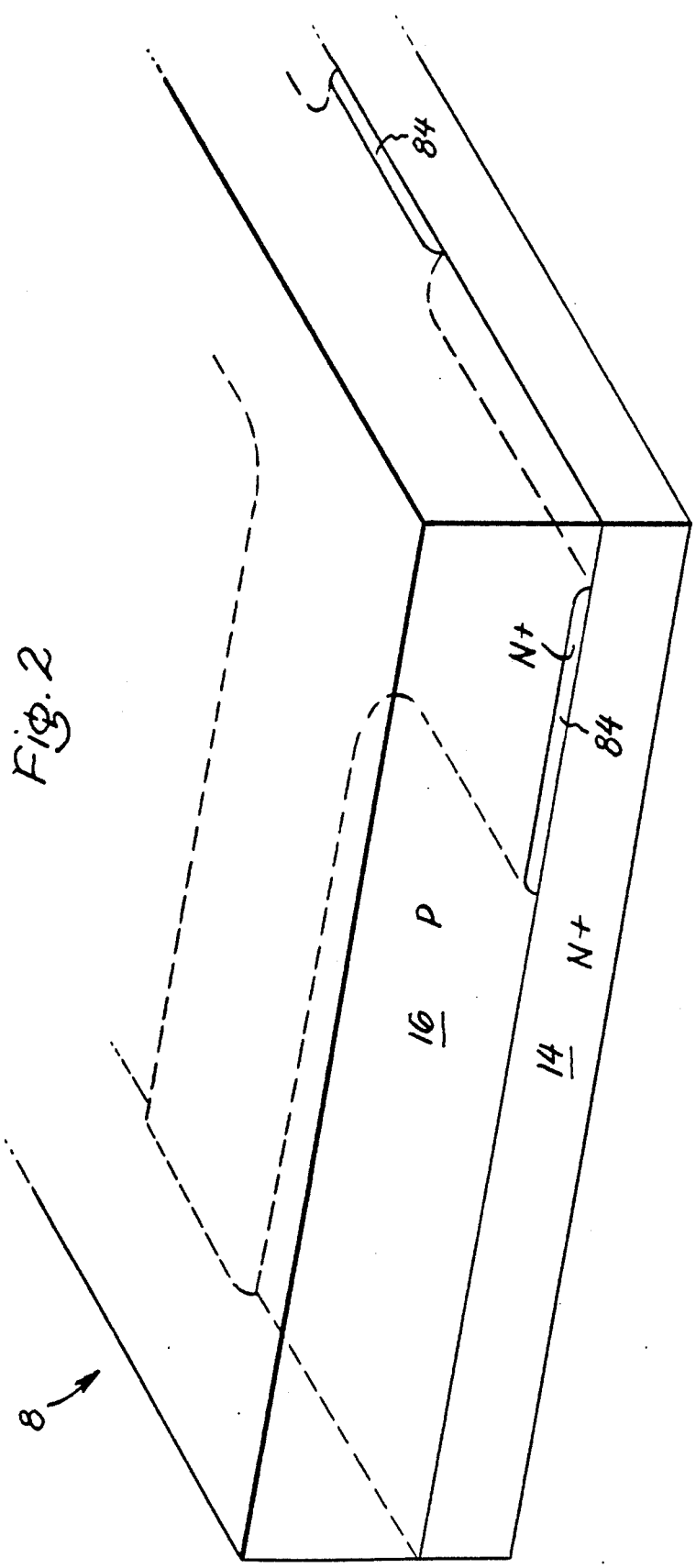
Figure 5:
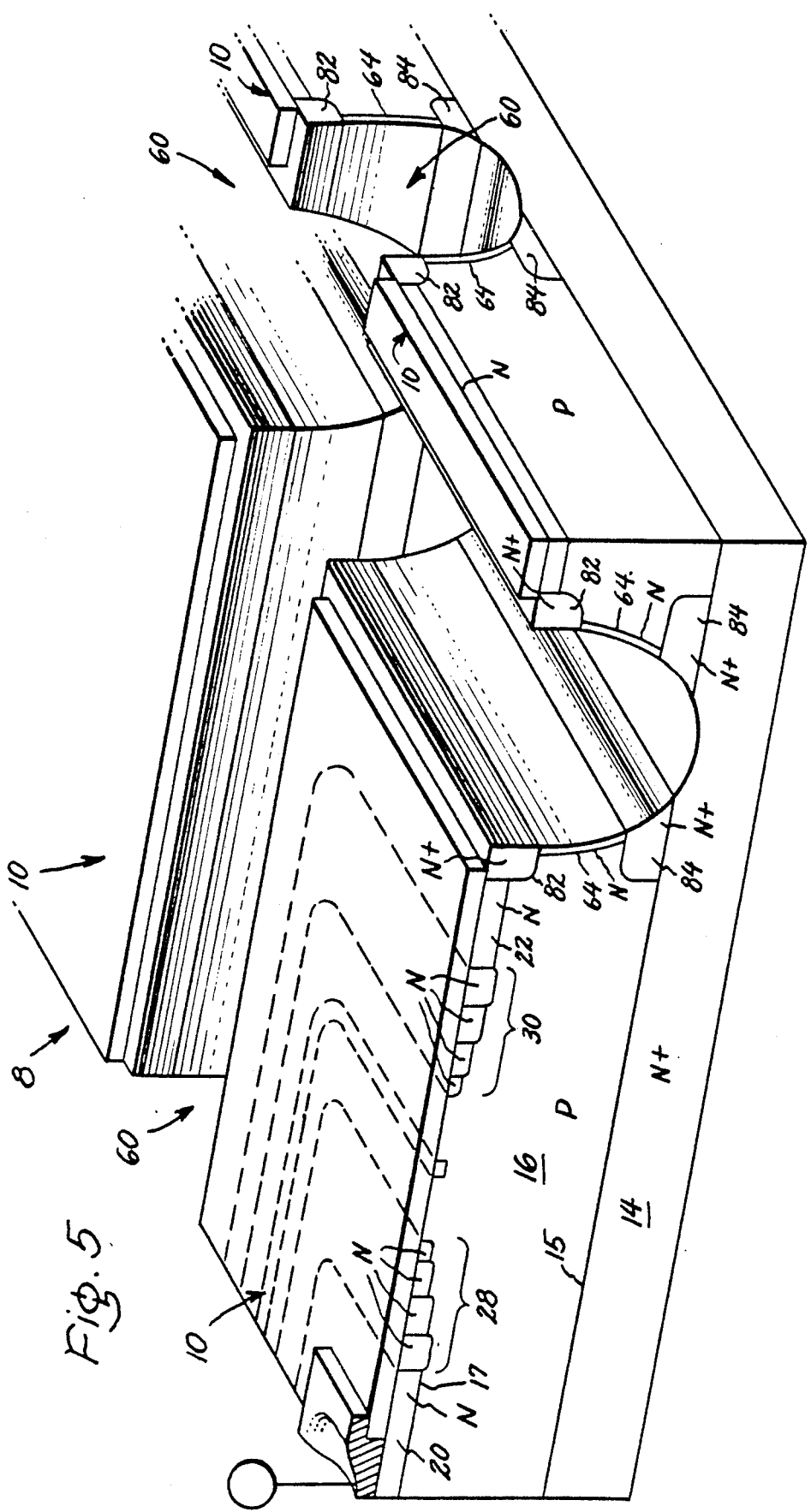
Figure 6:
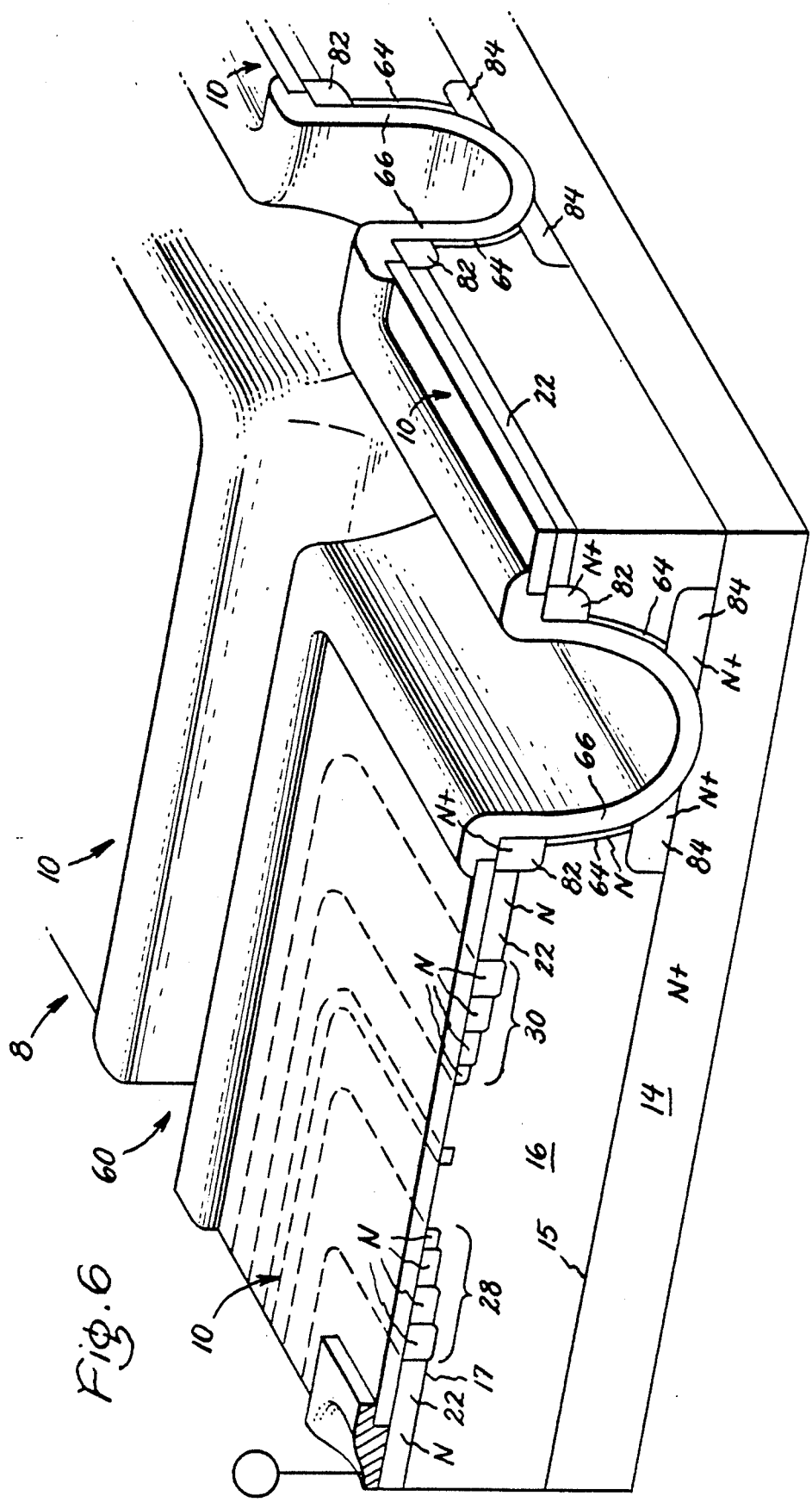

In FIG. 6, a portion of a wafer 8 containing completed devices 10 in accordance with one embodiment of the present invention is illustrated in a perspective, crosssection view. Portions of four devices 10 are shown in FIG. 6 along with the grooves 60 which separate these devices. These grooves are typically 100-200 microns deep and 200-400 microns wide. When dicing the wafer, the devices will be separated at the bottoms of the grooves The devices in FIG. 6 are similar to the devices in FIG. 1E of the above-identified related application except for the presence of the sinker regions 82 and the buried regions 84. The process of fabricating the devices of FIG. 6 is described in connection with FIGS. 1-6. In FIG. 1, a substrate wafer 14 which is heavily doped N type (N+), has had a source 83 of N type dopant disposed on its upper surface in a grid configuration which encompasses the locations where the buried region 84 is to be formed. The dopant 83 may be disposed on the surface or just below the surface as is well known in the art. The devices 10 will eventually be formed in the openings in the dopant grid. In FIG. 2, the wafer 8 is shown after growth of the lightly doped epitaxial P type region 16 on the upper surface of the substrate 14. During the growth of the epitaxial layer 16, the N type dopant 83 has diffused into the lower part of the epitaxial layer in the region where the dopant 83 was disposed thereby forming a relatively thin buried region 84 which is heavily doped N type (N+).

Figure 3:
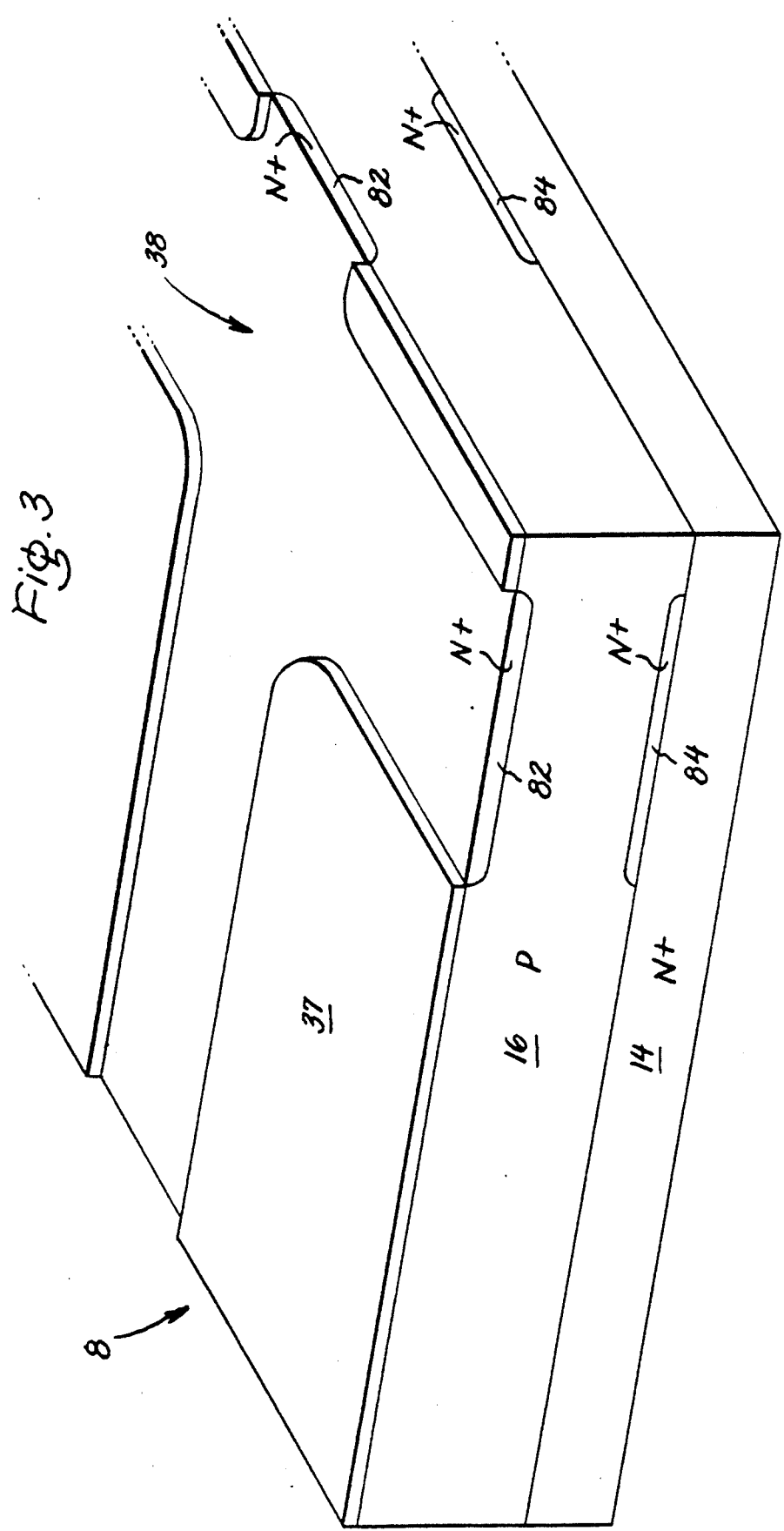

In FIG. 3, the wafer 8 is illustrated after the formation of a masking layer 37 on the upper surface of the epitaxial layer 16 and the opening of a grid-shaped window 38 therein substantially in alignment with the buried region 84 and the formation of a grid-shaped sinker region 82 in that window adjacent that surface. The sinker region 82 is heavily doped N type (N+). Next, the wafer is subject to the device fabrication processes appropriate to the devices being fabricated, which may preferably be MCTs.

Figure 4:
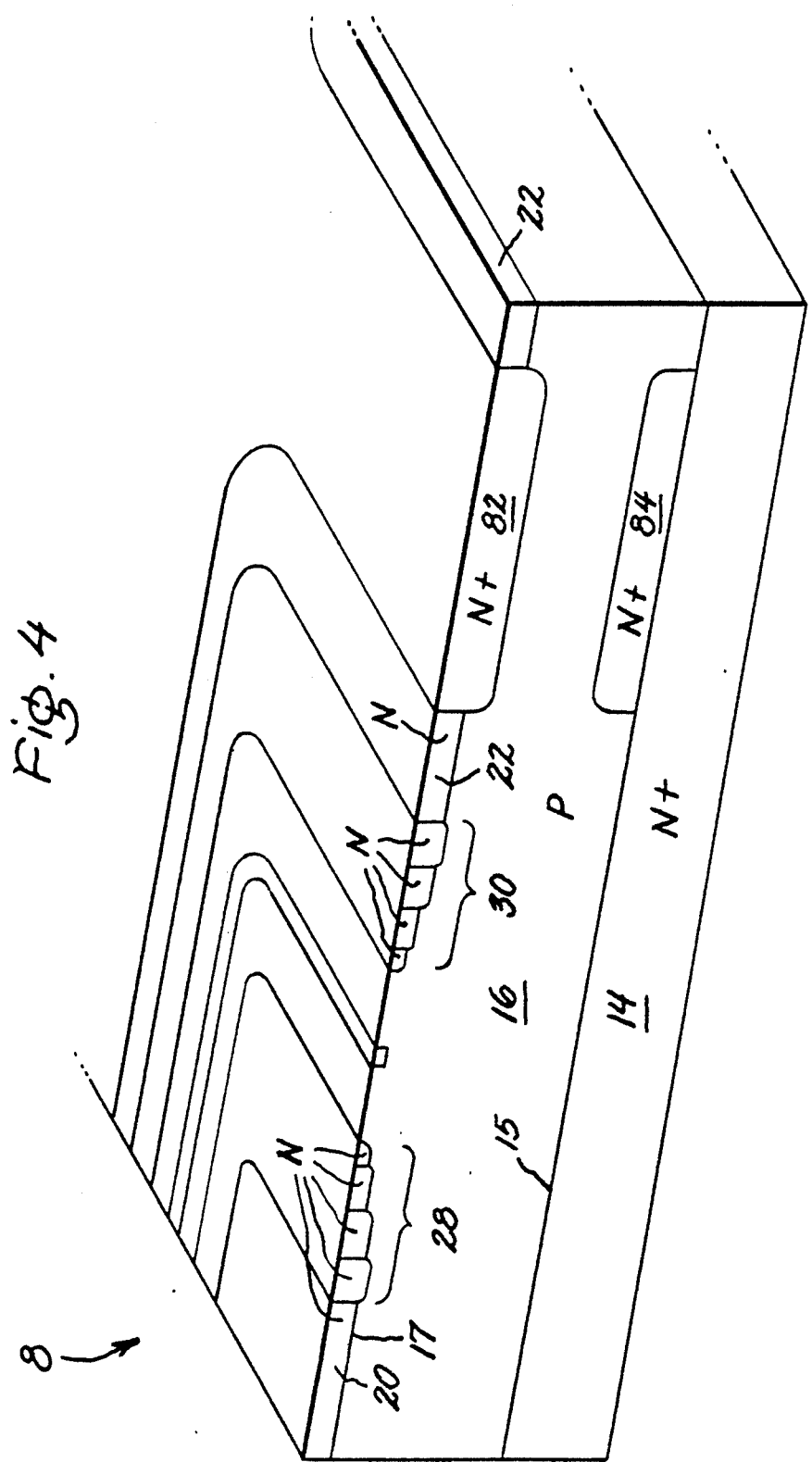

In FIG. 4, the wafer is shown after completion of the formation of the devices, including junction termination extensions (JTEs) 28 and 30 for the upper and lower high voltage blocking junctions 15 and 17, respectively, however the JTE 30 is not yet connected to lower high voltage junction 15. The regions 20 and 22 are upper regions which, depending on the device type, may be referred to as upper base regions. The regions 20, 22, 28 and 30 are all doped N type with the doping level in the regions 28 and 30 decreasing in a step fashion with increasing distance, respectively, from the base regions 20 and 22.

In FIG. 5, the wafer 8 is illustrated after the formation of the grooves 60 along whose surface the lower high voltage blocking junction 15 is brought to the upper surface by implantation of N type dopant along the surface of the groove to form a thin surface or sidewall region 64 along the exposed surface of the epitaxial layer 16. The grooves divide the grid-shaped sinker region 82 and the grid-shaped buried region 84 into a separate sinker region 82 and a separate buried region 84 for each of the devices 10. The sinker region 82 and the buried region 84 both extend around the entire periphery of the device 10. One of the substantial benefits of the sinker regions 82 is that the top of the groove where the exposed surface of the epitaxial material is most nearly perpendicular to the major surface of the wafer is already doped N type with the result that the ion implantation to create the sidewall region 64 does not need to dope the steepest portion of the chip sidewall. This substantially simplifies the process of implanting the region 64 as compared to the structure shown in the above-identified related application where no sinker region is present. Consequently, the device 10 provides a significant improvement even in the absence of a buried region 84. The buried region 84, in combination with the sinker region 82, provides a benefit of substantially reducing the vertical thickness of the P type region 16 in the peripheral portion of the chip. For high reverse bias of the lower blocking junction 15, the depletion regions extending from the sinker and buried regions into the P type region 16 can pinch off the P type region, thereby preventing the appearance of significant voltages along the peripheral surface of the chip. As a consequence, passivation may be omitted from that surface. A substantial benefit of omitting passivation from the peripheral surface of the chip is that it avoids the complexities and yield problems associated with attempting to selectively passivate the peripheral surface of the chip after completion of the device fabrication process, including the formation and patterning of the metallizations, which are completed prior to etching of the grooves 60.

In FIG. 6, the wafer 8 of FIG. 5 is illustrated with a passivation layer 66 formed in the grooves 60. This passivation layer, if present, may be formed in the manner taught in the above-identified related application and must be formed using a low temperature process because of the presence of a metallization on the devices.

Figure 7:
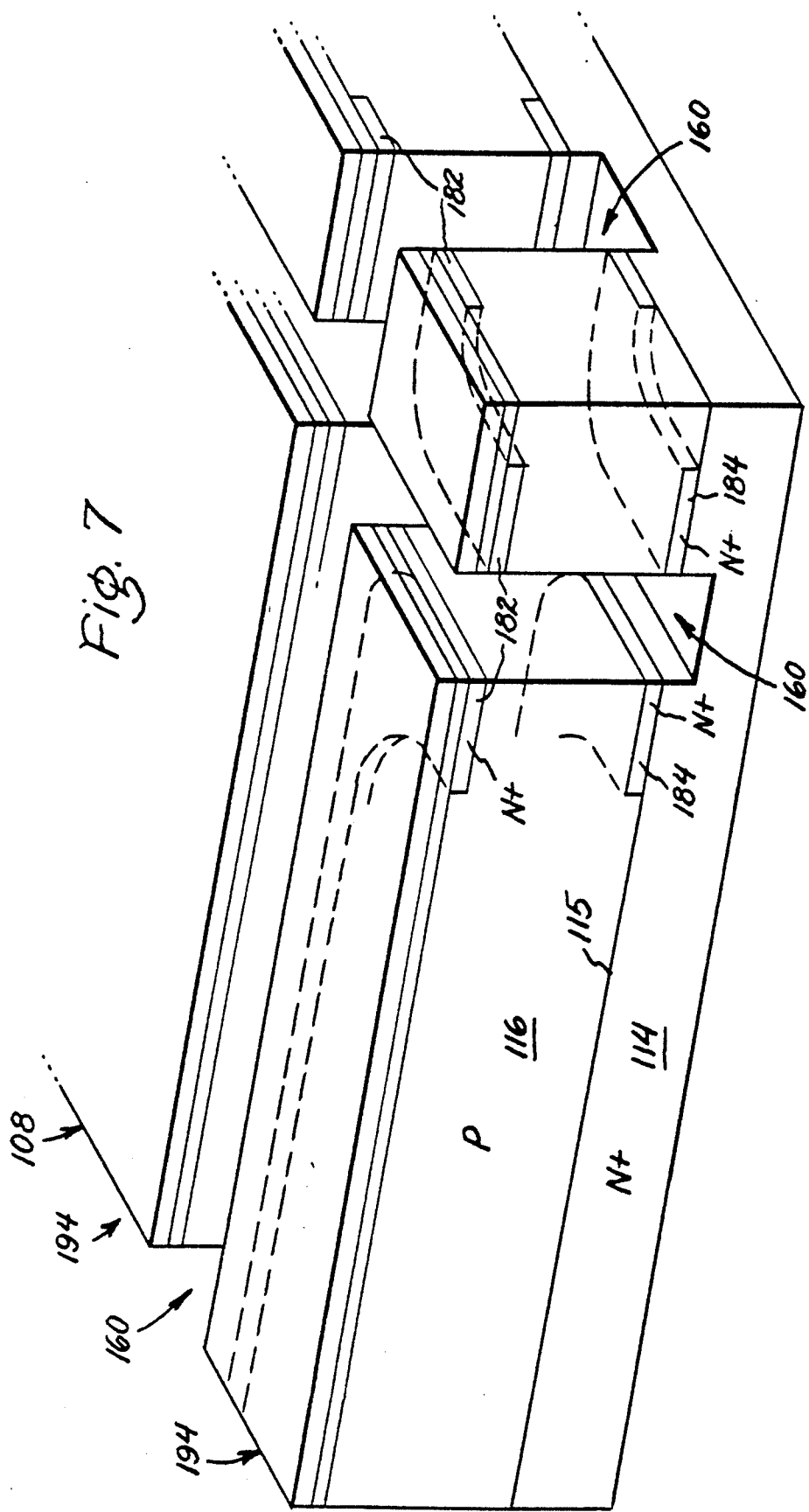
FIGS. 7-12 illustrate successive steps in the fabrication of another embodiment of the present invention.
Figure 8:
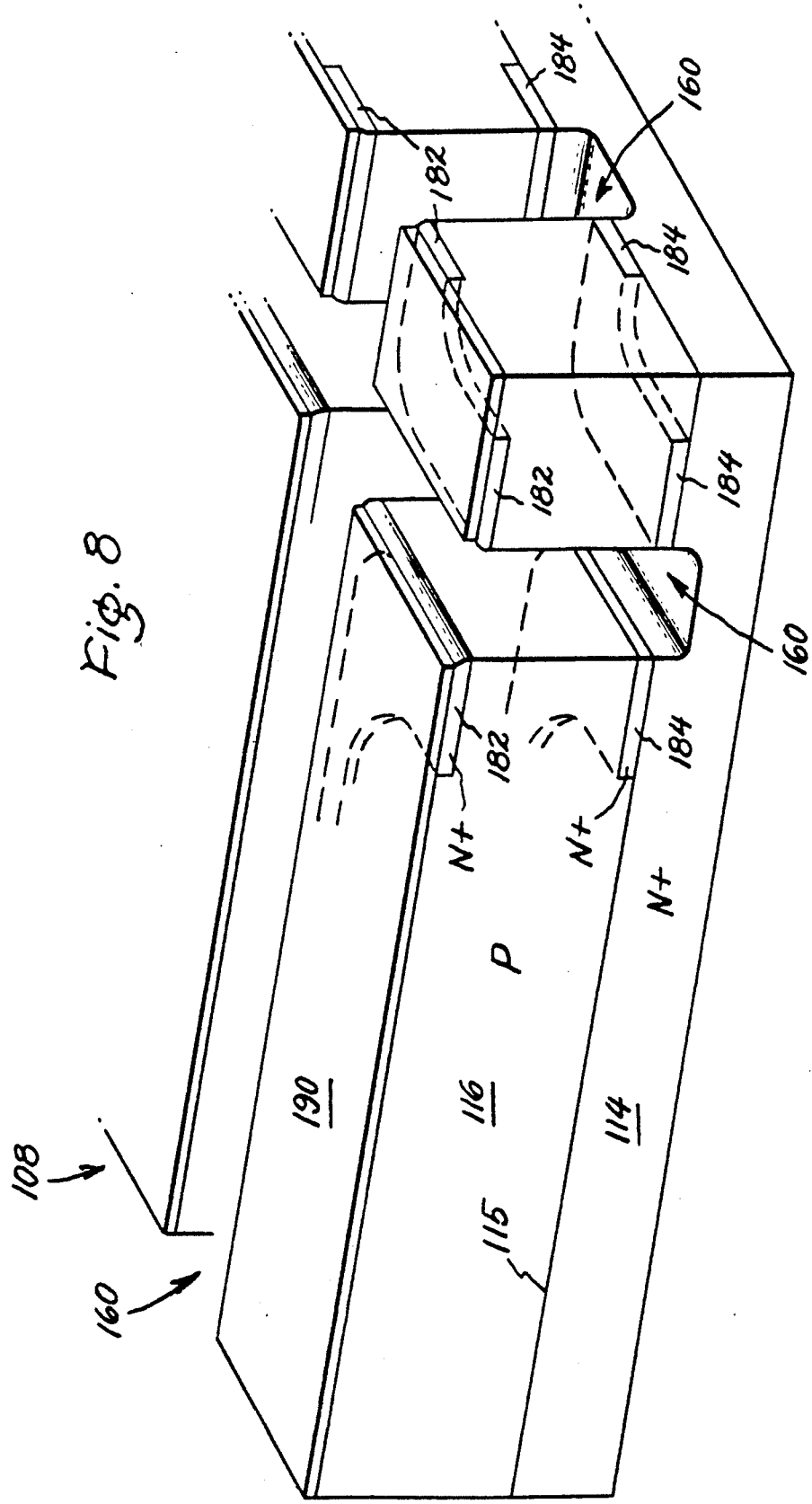
Figure 9:
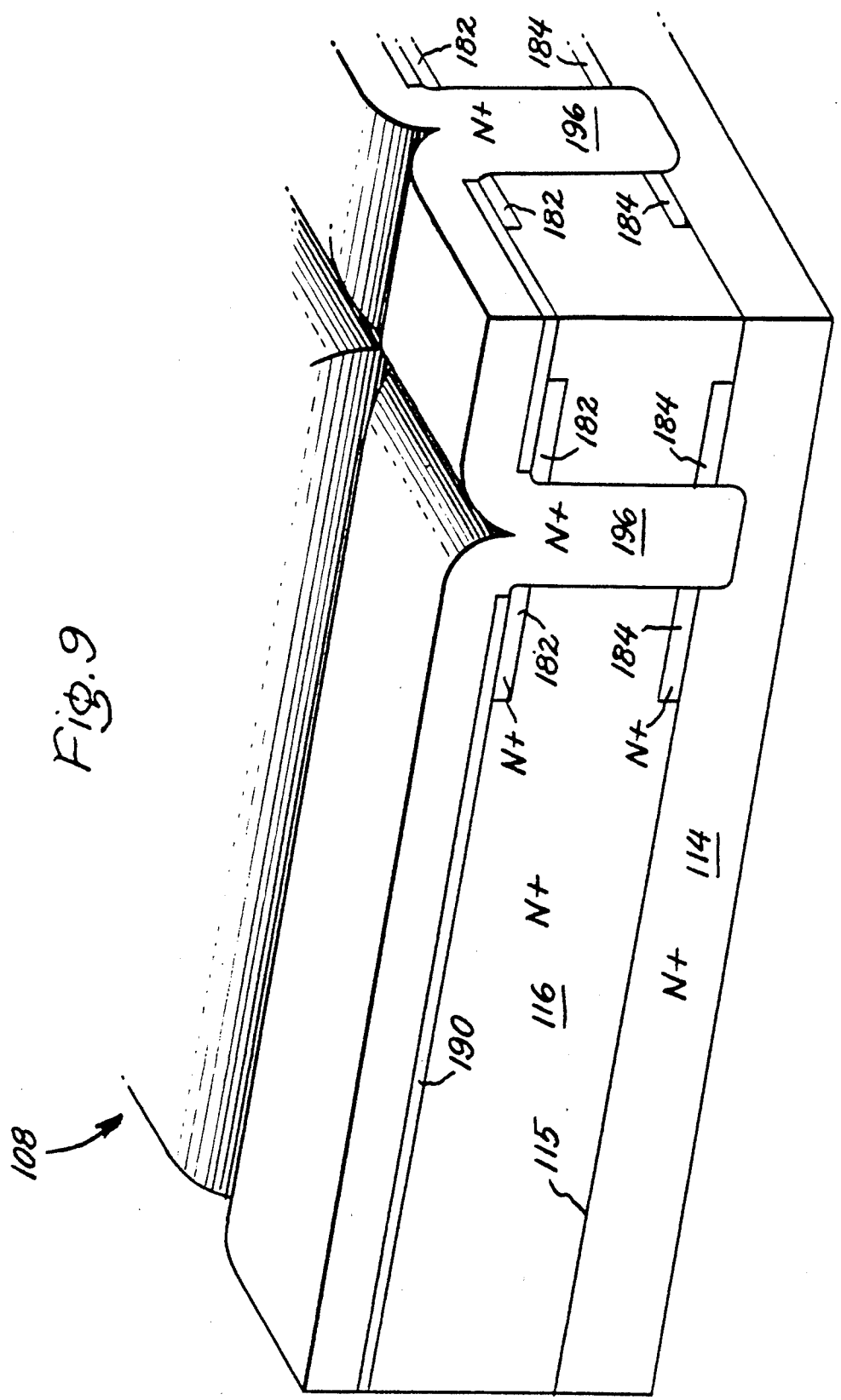
Figure 12:
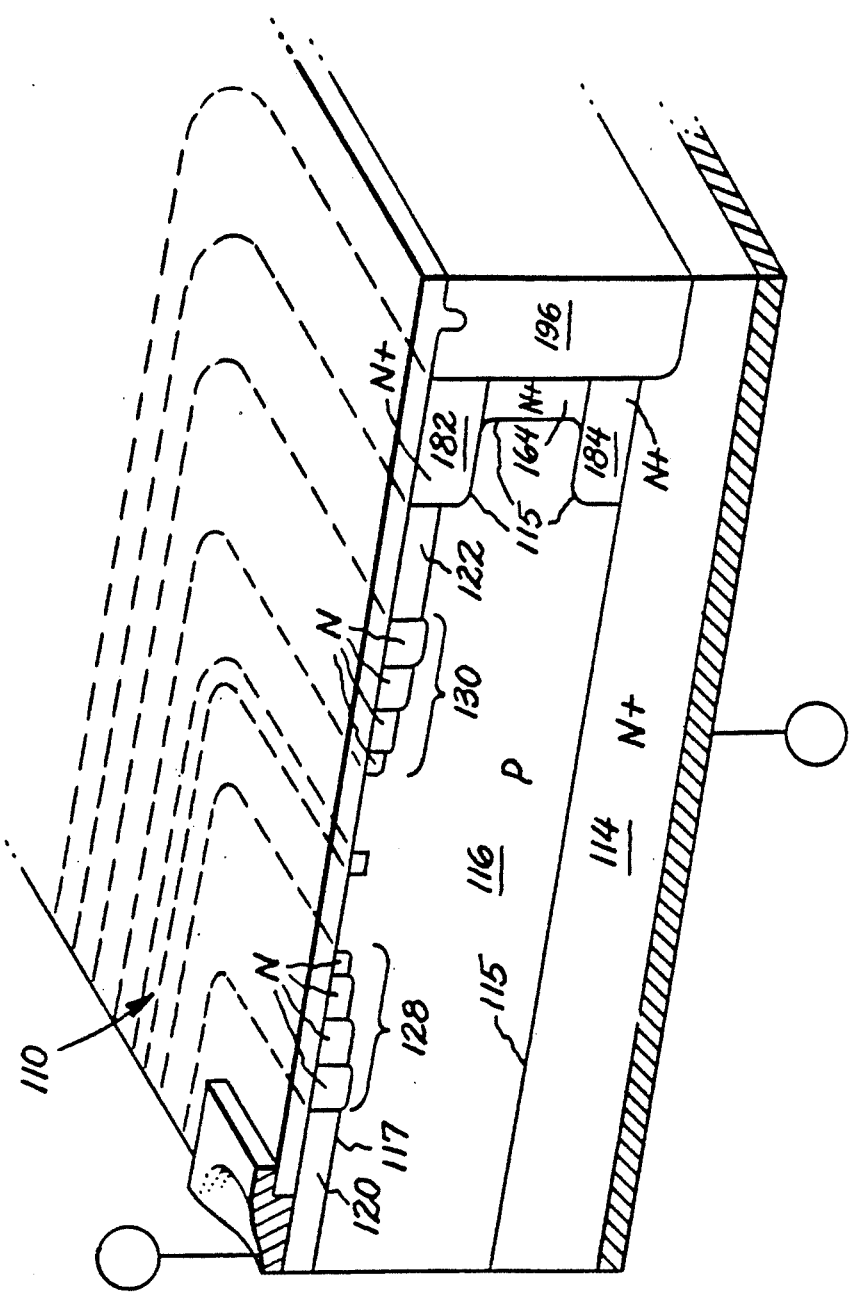

A device 110 in accordance with an alternative embodiment of the present invention is illustrated in FIG. 12 in a perspective cross-section view. In this structure, a polycrystalline region 196, which is heavily doped N type, spaces the lightly doped P region 116 from the peripheral surfaces of the chips. The fabrication of this structure is discussed in connection with FIGS. 7-12. The process of fabricating the device 110 begins with the wafer 8 in the configuration shown in FIG. 3 with the buried region 184 and the sinker region 182 of FIG. 12 in place. A dielectric etch stop layer 190, such as silicon nitride, is formed on the upper surface of the wafer. A photoresist layer 192 may be formed on that etch stop, if desired. A saw trench grid 160 is then formed in the wafer centered in the sinker region 182 grid pattern and extending through the epitaxial layer into the substrate, thereby providing a wafer 108 as shown in FIG. 7. The sawn trench 160 is formed prior to the formation of the devices. The sawn trench or saw kerf 160 is typically 40-60 microns wide and deep enough (100-200 microns) to extend through the epitaxial layer 116 into the substrate 114 to separate the epitaxial layer into separate monocrystalline segments or islands 194 in which individual devices will be fabricated. The sawing of the trench grid is followed by etching the groove surfaces to remove saw damage and by removal of the resist 192, if present. The photoresist is not necessary where the grooves 160 are formed by sawing, but would be needed for window definition if the grooves were formed by etching. The etch stop layer 190 is retained.

Figure 10:
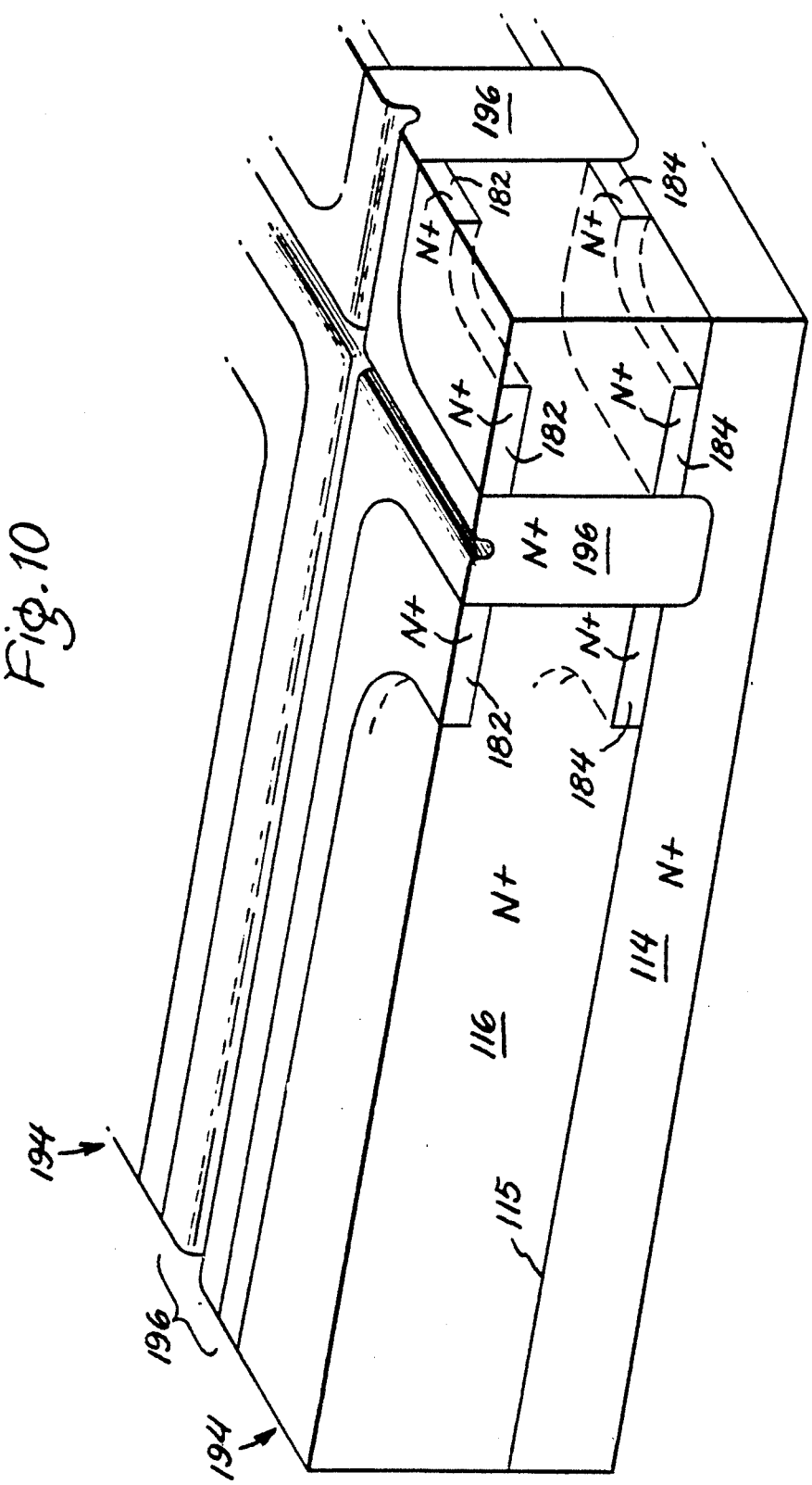
Figure 11:
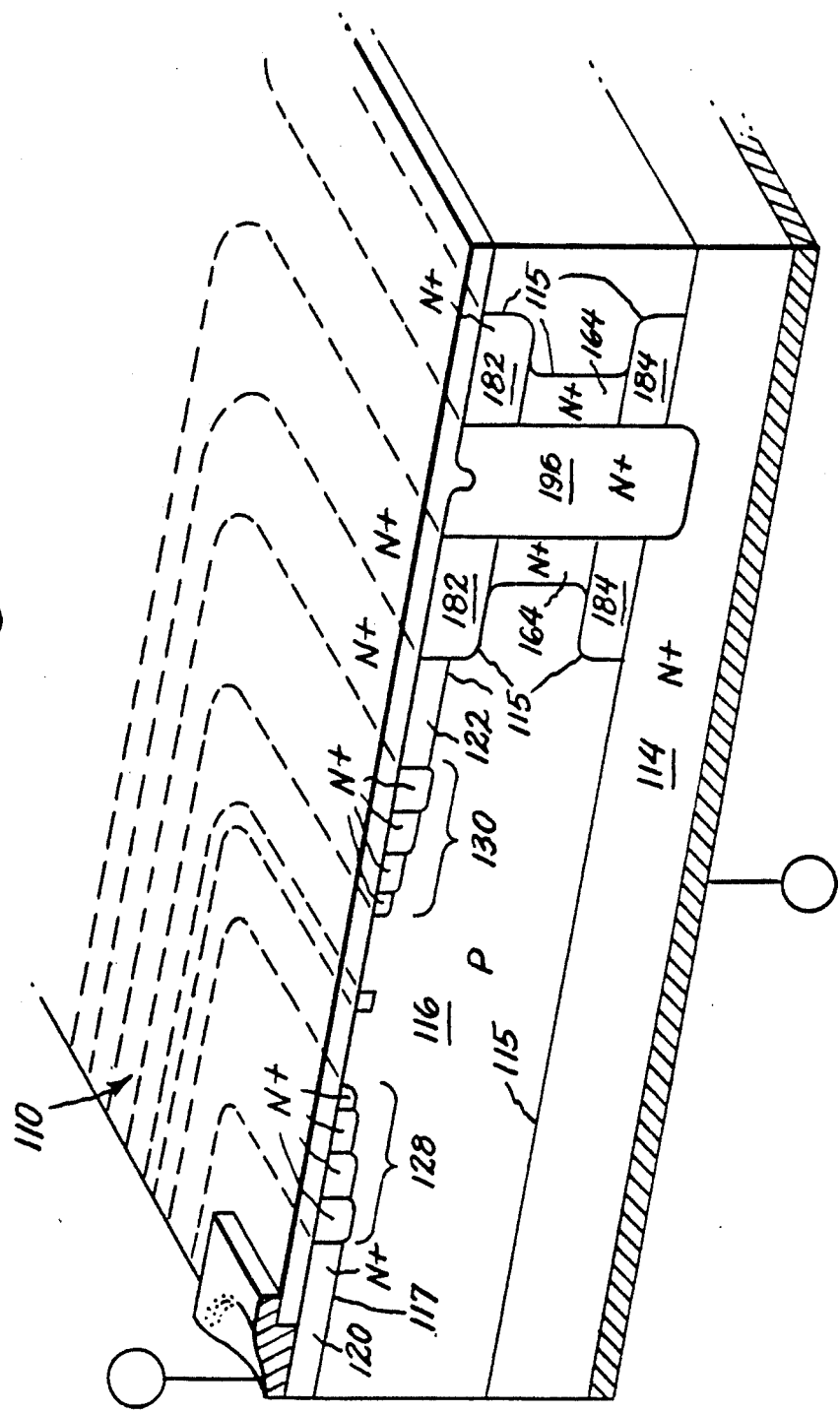

The trench 160 is then refilled by silicon epitaxy with polycrystalline silicon 196 which is heavily doped N type. Once the trench has been filled, the wafer is planarized by etching the polysilicon back to the etch stop layer 190 using a highly selective etch such as a KOH based etch or by a combination of mechanical silicon removal such as by lapping, followed by chemical etching. The objective of this planarization step is to provide wafer 108 with an upper surface topology which is sufficiently planar to enable fine line lithography processes to be used in fabricating the devices within the separate epitaxial islands. Following the planarization of the wafer, the dielectric etch stop layer 190 is removed and the wafer appears as shown in FIG. 10.

Thereafter, the desired devices are formed in the epitaxial islands 194 along with junction termination extensions for both the upper high voltage junction 117 and the lower high voltage junction 115 where it is brought to the surface. During the fabrication of these devices, the N type dopant in the heavily doped polycrystalline trench refill 196 diffuses into the P type monocrystalline silicon adjacent the trenches, thereby converting that surface portion of the intermediate region 116 to an N type region 164 and providing an N type material connection between the N type substrate 114 and the N type upper base region 122. This brings the lower high voltage junction 115 to the upper surface of the device for junction termination extension. The junction 163 between the region 164 and the region 116 is a deep junction as a result of diffusion of the N type dopant during each high temperature step in the device fabrication process. The boundary between the polycrystalline silicon and the active region of the device is substantially perpendicular to the upper surface of the device or wafer.

Figure 13:
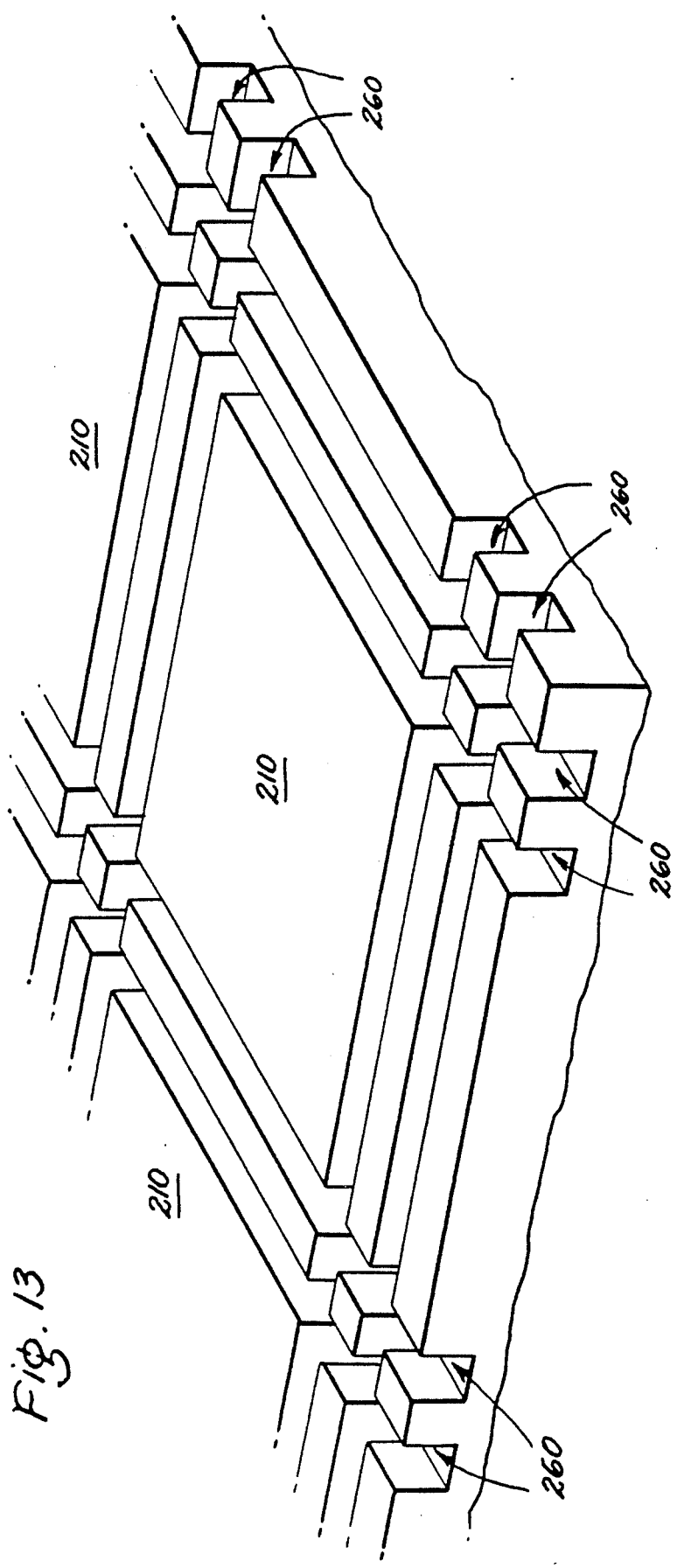
FIG. 13 illustrates an alternative arrangement in which double trenches are formed initially.

After completion of device fabrication, including metallization, the wafer is diced to form individual devices. This dicing may be done in the middle of the polycrystalline silicon refill 196, if the initial grooves 160 were sawn with a wider-kerf saw (for example 100-200 micron wide grooves after etching) than the saw to be used in dicing of the wafer (40-60 micron wide kerf). Alternatively, rather than forming a single grid of grooves 160, a double pattern of grooves 260 may be formed as shown in perspective view in FIG. 13 and the wafer may be diced by sawing of the monocrystalline material between the two adjacent grooves 260 of a pair.

This technique of sawing (or etching) the trenches and refilling them with polysilicon prior to beginning of the fabrication of the devices has the advantage that any wafer breakage resulting from the formation of the grooves should occur prior to the relatively expensive process of fabricating the individual devices. Thus, wafer breakage, even if present, is a relatively low cost problem. The number of devices which can be formed per wafer is roughly the same with either grooves 60 or double trenches 260 and somewhat greater with the trenches 160. While the sawn trench embodiment has been illustrated and described in terms of including the buried regions 184 and the sinker regions 182, this technique can be utilized with only the sinker region, with only the buried region or with neither the sinker region nor the buried region. While sawn grooves 160 are preferred, etched grooves may also be used. Etched grooves (because of their sloped walls) provide a groove shape which is less likely to result in voids in the polycrystalline refill 196 than sawn grooves which have substantially vertical walls. However, the greater depth and width of the grooves 60 makes the use of etched grooves (early in the process) for polysilicon refill unattractive.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. In a semiconductor device of the type having its main current path extending vertically through a central, active portion of a semiconductor chip which is spaced from the sidewall surface of said chip by a peripheral portion of said chip, said chip including a substrate, an intermediate region and an upper region, with said substrate and upper regions being of one type conductivity and said intermediate region being of opposite type conductivity and said device having a substrate/intermediate region high voltage blocking PN junction and an upper region/intermediate region high voltage blocking PN junction both of which extend to the upper surface of the device with the substrate/intermediate region junction being brought to said upper surface in said peripheral portion of said chip, the improvement comprising;

a buried layer of said one type conductivity extending into said intermediate region from said substrate in said peripheral portion of said chip whereby, said intermediate region is thinner in substantially the entire peripheral portion of said chip than in the active portion of said chip.

2. The improvement recited in claim 1 further comprising:

a sinker region of said one type conductivity extending into said intermediate region from the upper surface of said chip, said sinker region being spaced from said substrate.

3. In a semiconductor device of the type having its main current path extending vertically through a central, active portion of a semiconductor chip which is spaced from a peripheral surface of said chip by a peripheral portion of said chip, said chip including a substrate, an intermediate region and an upper region, with said substrate and upper regions being of one type conductivity and said intermediate region being of opposite type conductivity and said device having a substrate/intermediate region high voltage blocking PN junction and an upper region/intermediate region high voltage blocking PN junction both of which extend to the upper surface of the device with the substrate/intermediate region junction being brought to said upper surface in said peripheral portion of said chip, the improvement comprising:

a buried layer of said one type conductivity extending into said intermediate region from said substrate in said peripheral portion of said chip whereby, said intermediate region is thinner in the peripheral portion of said chip than in the active portion of said chip;

a sinker region of said one type conductivity extending into said intermediate region from the upper surface of said intermediate region in said peripheral portion of said chip; and said buried region and said sinker region are spaced apart vertically by a small enough distance that the portion of said intermediate region therebetween pinches off at a lower reverse bias across said substrate/intermediate region junction than the surface breakdown voltage of said chip.

4. The improvement recited in claim 3 wherein:
said peripheral surface of said chip is free of passivation layers.

5. The improvement recited in claim 4 wherein:
said chip includes a one type conductivity sidewall region along the periphery of said intermediate region extending from said sinker region to said buried region and spacing said intermediate region from said peripheral surface of said chip.

6. The improvement recited in claim 5 wherein:
said sidewall region is ion implanted.

7. The improvement recited in claim 5 wherein:
said chip includes a polysilicon region extending from said substrate to said upper surface between the active region of said device and said peripheral surface of said chip, said polysilicon region spacing said active region of said chip from said peripheral surface of said chip.

8. The improvement recited in claim 7 wherein:
said polysilicon region is heavily doped to said one type conductivity.

9. The improvement recited in claim 8 wherein:
the boundary between said polysilicon region and said active region is substantially perpendicular to said upper surface.

10. The improvement recited in claim 3 wherein:
said chip includes a one type conductivity sidewall region along the periphery of said intermediate region extending from said sinker region to said buried region and spacing said intermediate region from the peripheral surface of said chip.

11. The improvement recited in claim 10 wherein:
said chip includes a polysilicon region extending from said substrate to said upper surface between the active region of said device and said peripheral surface of said chip, said polysilicon region spacing said active region of said chip from said peripheral surface of said chip.

12. In a semiconductor device of the type having its main current path extending vertically through a central, active portion of a semiconductor chip which is spaced from the sidewall surface of said chip by a peripheral portion of said chip, said chip including a substrate, an intermediate region and an upper region, with said substrate and upper regions being of one type conductivity and said intermediate region being of opposite type conductivity and said device having a substrate/intermediate region high voltage blocking PN junction and an upper region/intermediate region high voltage blocking PN junction both of which extend to the upper surface of the device with the substrate/intermediate region junction being brought to said upper surface in said peripheral portion of said chip, the improvement comprising:
a buried layer of said one type conductivity extending into said intermediate region from said substrate in said peripheral portion of said chip whereby, said intermediate region is thinner in the peripheral portion of said chip than in the active portion of said chip;
a sinker region of said one type conductivity extending into said intermediate region from the upper surface of said intermediate region in said peripheral portion of said chip, said sinker region being spaced from said substrate,
said chip including a polysilicon region extending from said substrate to said upper surface between the active region of said device and said peripheral surface of said chip, said polysilicon region intersecting said sinker region and said buried layer and spacing said active region of said chip from said peripheral surface of said chip.

13. In a semiconductor device of the type having its main current path extending vertically through a central, active portion of a semiconductor chip which is spaced from the sidewall surface of said chip by a peripheral portion of said chip, said chip including a substrate, an intermediate region and an upper region, with said substrate and upper regions being of one type conductivity and said intermediate region being of opposite type conductivity and said device having a substrate/intermediate region high voltage blocking PN junction and an upper region/intermediate region high voltage blocking PN junction both of which extend to the upper surface of the device with the substrate/intermediate region junction being brought to said upper surface in said peripheral portion of said chip, the improvement comprising:
a buried layer of said one type conductivity extending into said intermediate region from said substrate in said peripheral portion of said chip whereby, said intermediate region is thinner in the peripheral portion of said chip than in the active portion of said chip,
said chip including a polysilicon region extending from said substrate to said upper surface between the active region of said device and said peripheral surface of said chip, said polysilicon region intersecting said buried layer and spacing said active region of said chip from said peripheral surface of said chip.

14. In a semiconductor device of the type having its main current path extending vertically through an active portion of a semiconductor chip and having a substrate, an intermediate region and an upper region, with said substrate and upper regions being f one type conductivity and said intermediate region being of opposite type conductivity and having a substrate/intermediate region high voltage blocking PM junction and an upper region/intermediate region high voltage blocking PM junction both of which extend to the upper surface of the device with the substrate/intermediate region junction being brought to said upper surface along the periphery of the active portion of the device, said chip including a polysilicon region extending from said substrate to said upper surface between the active region of said device and said peripheral surface of said chip, the improvement comprising:
a sinker region of said one type conductivity extending into said intermediate region from the upper surface of said intermediate region adjacent the peripheral surface of said chip, said sinker region being spaced from said substrate, said polysilicon region intersecting said sinker region and spacing said active region of said chip from said peripheral surface of said chip.

15. The improvement recited in claim 14 wherein:
said chip includes a one type conductivity sidewall region along the periphery of said intermediate region extending from said sinker region to said substrate and spacing said intermediate region from said peripheral surface of said chip.

16. The improvement recited in claim 15 wherein:
said sidewall region is ion implanted.

17. The improvement recited in claim 15, wherein:

said polysilicon region is heavily doped to said one type conductivity.

18. The improvement recited in claim 14 wherein said polysilicon region is heavily doped to said one type conductivity.

19. The improvement recited in claim 18 wherein: the boundary between said polysilicon region and active region of said device is substantially perpendicular to said upper surface.

* * * * *